(12) United States Patent
Yaung et al.

(10) Patent No.: US 7,847,847 B2
(45) Date of Patent: Dec. 7, 2010

(54) STRUCTURE FOR CMOS IMAGE SENSOR WITH A PLURALITY OF CAPACITORS

(75) Inventors: Dun-Nian Yaung, Taipei (TW); Kuo-Ching Huang, Hsin Chu (TW); Ho-Ching Chien, Hsinchu County (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1123 days.

(21) Appl. No.: 11/044,922

(22) Filed: Jan. 27, 2005

(65) Prior Publication Data

US 2006/0164531 A1 Jul. 27, 2006

(51) Int. Cl.
*H04N 3/14* (2006.01)
*H04N 5/335* (2006.01)

(52) U.S. Cl. ...................... 348/308; 348/294
(58) Field of Classification Search ............... 348/294, 348/302, 308
See application file for complete search history.

(56) References Cited

U.S. PATENT DOCUMENTS

| | | | |
|---|---|---|---|
| 5,672,891 A * | 9/1997 | Hamamoto et al. | 257/301 |
| 6,069,376 A | 5/2000 | Merrill | |
| 6,194,770 B1 * | 2/2001 | Zarnowski et al. | 257/436 |
| 6,243,134 B1 * | 6/2001 | Beiley | 348/308 |
| 6,429,470 B1 | 8/2002 | Rhodes | |
| 6,441,412 B2 | 8/2002 | Oh et al. | |
| 6,458,717 B1 * | 10/2002 | Lee et al. | 438/778 |
| 6,521,924 B2 | 2/2003 | Han et al. | |
| 6,570,222 B2 | 5/2003 | Nozaki et al. | |
| 6,809,309 B2 * | 10/2004 | Kwon | 250/214.1 |
| 6,852,591 B2 * | 2/2005 | Rhodes | 438/244 |
| 6,947,084 B2 * | 9/2005 | Kaifu et al. | 348/247 |
| 7,170,041 B2 * | 1/2007 | Rahn | 250/208.1 |
| 7,235,835 B2 | 6/2007 | Nagano et al. | |
| 7,385,166 B2 * | 6/2008 | Fossum | 250/208.1 |
| 7,489,352 B2 * | 2/2009 | Nakamura | 348/296 |
| 2003/0020002 A1 * | 1/2003 | Lee | 250/208.1 |
| 2003/0137008 A1 | 7/2003 | Nozaki et al. | |
| 2003/0209740 A1 * | 11/2003 | Miyamoto et al. | 257/286 |
| 2004/0000632 A1 * | 1/2004 | Apte | 250/208.1 |
| 2004/0013232 A1 * | 1/2004 | Rahn | 378/98.8 |
| 2004/0099886 A1 | 5/2004 | Rhodes et al. | |
| 2004/0196398 A1 * | 10/2004 | Doering et al. | 348/308 |
| 2005/0064658 A1 * | 3/2005 | Biery et al. | 438/239 |
| 2006/0164531 A1 * | 7/2006 | Yaung et al. | 348/308 |

FOREIGN PATENT DOCUMENTS

CN 1484285 A 3/2004

(Continued)

*Primary Examiner*—Gevell Selby
(74) *Attorney, Agent, or Firm*—Slater & Matsil, L.L.P.

(57) ABSTRACT

A CMOS image sensor having increased capacitance that allows a photo-diode to generate a larger current is provided. The increased capacitance reduces noise and the dark signal. The image sensor utilizes a transistor having nitride spacers formed on a buffer oxide layer. Additional capacitance may be provided by various capacitor structures, such as a stacked capacitor, a planar capacitor, a trench capacitor, a MOS capacitor, a MIM/PIP capacitor, or the like. Embodiments of the present invention may be utilized in a 4-transistor pixel or a 3-transistor pixel configuration.

28 Claims, 8 Drawing Sheets

FOREIGN PATENT DOCUMENTS

| | | |
|---|---|---|
| JP | 64-050460 | 2/1989 |
| JP | 08-205034 | 8/1996 |
| JP | 11-121730 | 4/1999 |
| JP | 2001-250934 | 9/2001 |
| JP | 2001-345439 | 12/2001 |
| WO | WO 03/096421 A1 | 11/2003 |

* cited by examiner

STRUCTURE FOR CMOS IMAGE SENSOR WITH A PLURALITY OF CAPACITORS

TECHNICAL FIELD

The present invention relates generally to semiconductor devices, and more particularly, to a complementary metal-oxide-semiconductor image sensor.

BACKGROUND

Complementary metal-oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

Generally, CMOS image sensors utilize light-sensitive CMOS circuitry to convert light energy into electrical energy. The light-sensitive CMOS circuitry typically comprises a photo-diode formed in a silicon substrate. As the photo-diode is exposed to light, an electrical charge is induced in the photo-diode. The photo-diode is typically coupled to a MOS switching transistor, which is used to sample the charge of the photo-diode. Colors may be determined by placing filters over the light-sensitive CMOS circuitry.

Typically, CMOS image sensors are fabricated utilizing a capacitance within the photo-diode and a floating capacitance created between transistor connections. These capacitances, however, are characterized by small capacitance values, which cause a high susceptibility to noise and reduce the maximum output signal. Attempts have been made to increase the signal generated by a photo-diode, but these typically only increase the electrical charge generated by the photo-diode and do not necessarily increase the output signal.

Furthermore, CMOS image sensors are typically fabricated utilizing MOS transistors having a polysilicon gate and silicon nitride spacers. This type of transistor, however, introduces a silicon surface trap and leakage. As a result, noise on the output signal increases and the dark signal increases.

Therefore, there is a need for an image sensor that reduces noise and a dark signal and increases charge capacity of the image sensor.

SUMMARY OF THE INVENTION

These and other problems are generally reduced, solved or circumvented, and technical advantages are generally achieved, by embodiments of the present invention, which provides a complementary metal-oxide-semiconductor image sensor.

In an embodiment of the present invention, an image sensor is provided. The image sensor includes a first transistor coupled to an optical sensing element. The first transistor comprises a gate electrode having spacers formed alongside, wherein the spacers include a nitride spacer over a buffer oxide layer. The first transistor is also coupled to a capacitor. The capacitor may be, for example, a planar capacitor, a stacked capacitor, a MOS capacitor, a MIM capacitor, a PIP capacitor, or the like. The buffer oxide layer is preferably thicker than the gate dielectric.

In another embodiment of the present invention, an image sensor having four transistors is provided. The image sensor comprises an optical sensing element, a first transistor, a first capacitor, and a second capacitor. The first transistor is electrically coupled to the optical sensing element and has a gate electrode over a gate dielectric and spacers alongside the gate electrode. The spacers of the first transistor comprise a nitride spacer over a buffer oxide, wherein the buffer oxide is preferably thicker than the gate dielectric. The first capacitor is electrically coupled to a source of the first transistor and the optical sensing element, and the second capacitor is electrically coupled to a drain of the first transistor. Each of the first capacitor and the second capacitor may be, for example, a planar capacitor, a stacked capacitor, a MOS capacitor, a MIM capacitor, a PIP capacitor, or the like.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
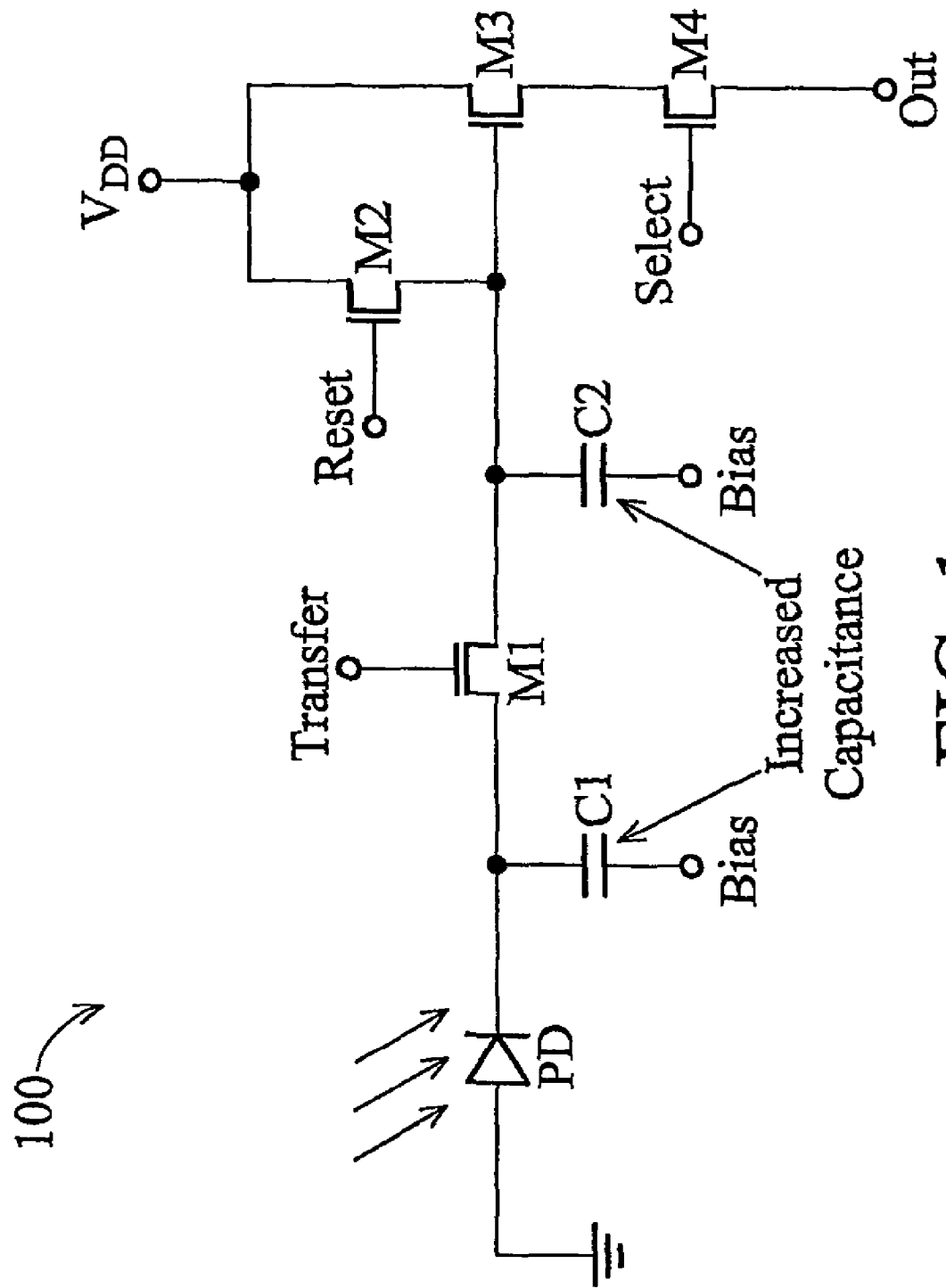
FIG. 1 is a schematic diagram of a 4 transistor image pixel in accordance with an embodiment of the present invention.

Referring first to FIG. 1, a schematic of a 4-transistor (4T) CMOS pixel 100 having increased capacitance in accordance with an embodiment of the present invention is shown. The 4T image pixel comprises a photo-diode PD having an anode coupled to ground and a cathode coupled to a first plate of a first capacitor C1 and a source connection of a first transistor M1. The second plate of the first capacitor C1 may be coupled to a bias, such as ground, $V_{DD}$, $0.5*V_{DD}$, or the like. The first transistor M1 is a transfer transistor and has a gate electrode coupled to a transfer line.

The drain of the first transistor M1 is coupled to a first plate of a second capacitor C2, a drain of a second transistor M2, and a gate of a third transistor M3. A second plate of the second capacitor C2 may be coupled to a bias, such as ground, $V_{DD}$, $0.5*V_{DD}$, or the like.

The second transistor M2, which acts as a reset transistor, has a gate electrode coupled to a reset line. The source of the second transistor M2 is coupled to a voltage source $V_{DD}$. A source of the third transistor M3 is coupled to $V_{DD}$, and a drain of the third transistor M3 is coupled to a fourth transistor M4, which acts as a select transistor. A gate of the fourth transistor M4 is coupled to a select line, and a drain of the fourth transistor M4 is coupled to an output line.

It should be appreciated that, in accordance with an embodiment of the present invention, the first capacitor C1 and the second capacitor C2 are a capacitor structure that provides an additional capacitance to the photo-diode PD. The first capacitor C1 and the second capacitor C2 may be, for example, a stacked capacitor, a planar capacitor, a MOS capacitor, a trench capacitor, a MIM/PIP capacitor, or the like.

It should be noted that FIG. 1 illustrates a schematic of a single pixel in a CMOS image sensor. The pixel illustrated in FIG. 1 may be duplicated and circuitry may be added to provide an image sensor with multiple pixels.

In operation, light generates an electrical charge in the photo-diode PD. Due to the increased capacitance of the first capacitor C1, the photo-diode PD is able to generate and store an electrical charge equivalent to the capacitance of the first capacitor C1. The electrical charge is transferred by enabling the first transistor M1, at which point the electrical charge is transferred to the second capacitor C2. Thus, the electrical charge transferred may be equivalent to the maximum capacitance of the second capacitor C2.

The electrical charge transferred from the photo-diode PD by the first transistor M1 enables the third transistor M3, thereby allowing an electrical charge proportional to the charge generated by the photo-diode PD to pass from voltage source $V_{DD}$ through the third transistor M3 to the fourth transistor M4. When sampling is desired, the select line is enabled, allowing the electrical charge to flow through the fourth transistor M4 to the output line.

As will be described in greater detail below, the transistors, particularly the first transistor M1 and the second transistor M2, are preferably fabricated utilizing an oxide buffer under a silicon nitride spacer. It has been found that transistors formed in this manner trap less charge, thereby decreasing noise and the dark signal generated by the pixel 100.

Figure 2:
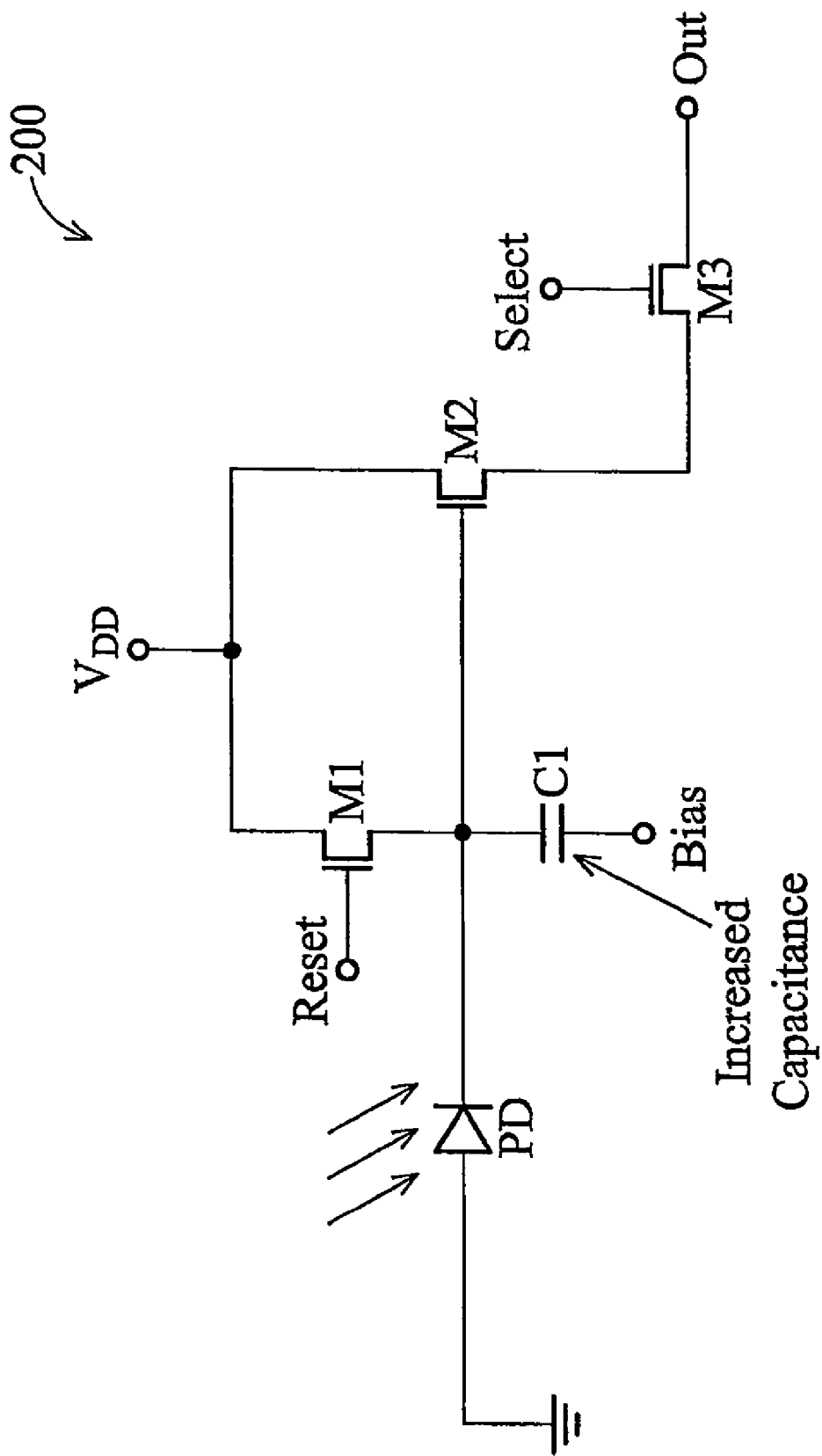
FIG. 2 is a schematic diagram of a 3 transistor image pixel in accordance with an embodiment of the present invention.

FIG. 2 illustrates a 3-transistor (3T) pixel 200 in accordance with an embodiment of the present invention. The 3T pixel 200 comprises a photo-diode PD having an anode coupled to ground and a cathode coupled to a first plate of a first capacitor C1, a drain of a first transistor M1 and a gate of a second transistor M2. A second plate of the first capacitor C1 is coupled to a bias, such as ground, $V_{DD}$, $0.5*V_{DD}$, or the like. A gate of the first transistor M1 is coupled to a reset line.

A source of the first transistor M1 and a source of the second transistor M2 are coupled to a voltage source $V_{DD}$. The drain of the second transistor M2 is coupled to a source of a third transistor M3, which acts as a select transistor. The gate of the second transistor M2 is coupled to a select line, and the drain of the second transistor M2 is coupled to an output line.

In accordance with an embodiment of the present invention, the first capacitor C1 comprises a capacitor larger than what is typically available with prior art designs in which the capacitor is formed by the diffusion regions of the photo-diode PD. Preferably, the first capacitor C1 comprises a MOS capacitor, a trench capacitor, a stack capacitor, a planar capacitor, a MIM/PIP capacitor, or the like.

In operation, light generates an electrical charge in the photo-diode PD. Due to the first capacitor C1, the photo-diode PD is able to generate and store an electrical charge equivalent to the capacitance of the first capacitor C1. The electrical charge enables the second transistor M2, at which point an electrical charge proportional to the electrical charge generated by the photo-diode PD is transferred to the third transistor M3. When sampling is desired, the select line is enabled, allowing the electrical charge to flow through the third transistor to the output line.

In a preferred embodiment, the transistors, particularly the first transistor M1, are fabricated utilizing an oxide buffer under a silicon nitride spacer. It has been found that transistors formed in this manner trap less charge, thereby decreasing noise and the dark signal generated by the pixel 200.

FIGS. 3-8 illustrate various embodiments of the present invention in which the capacitance of the first capacitor C1 and the second capacitor C2 of FIG. 1 is increased. It should be noted that FIGS. 3-8 are provided for illustrative purposes only and that the entire cell structure is not illustrated. Rather, only the portion related to the photo-diode, capacitors, and transistors having a buffer oxide are shown. Other configurations, such as different capacitors, layouts, or the like, may be used. It should also be noted that the configurations illustrated in FIGS. 3-8 relate to the 4T pixel illustrated in FIG. 1. Similar configurations may be used in the 3T pixel illustrated in FIG. 2, except that the transistor of FIGS. 3-8 of a 3T pixel typically has its source/drain electrically coupled to a capacitor and $V_{DD}$ rather than two capacitors.

Figure 3:
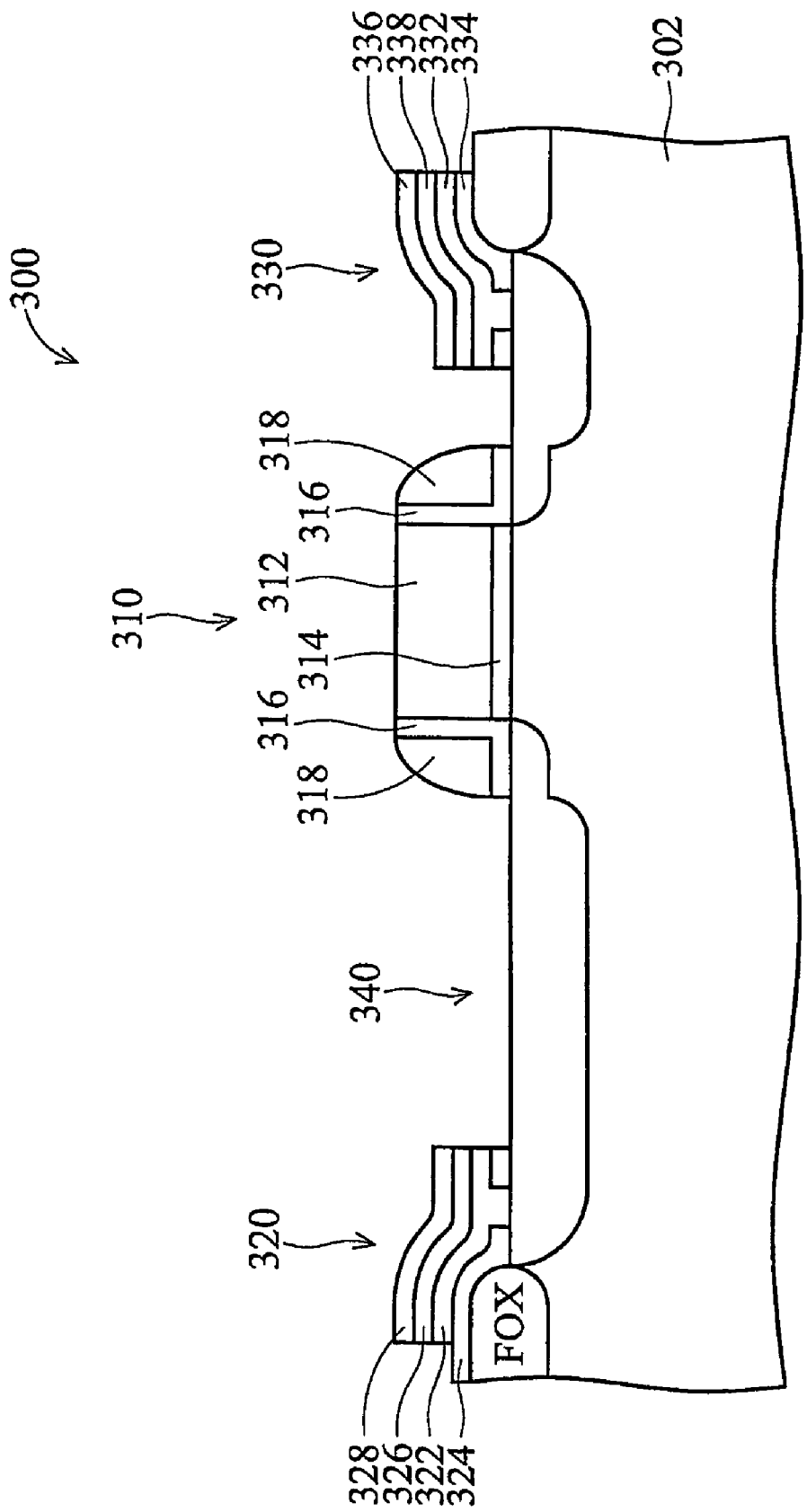
FIG. 3 is a cross section figure of an image pixel utilizing stacked capacitors in accordance with an embodiment of the present invention.

Referring first to FIG. 3, a cross section of a portion of a pixel 300 utilizing a pair of stacked capacitors in accordance with an embodiment of the present invention is shown. Pixel 300 includes a transistor 310, a first stacked capacitor 320, a second stacked capacitor 330, and a photo-diode 340. The transistor 310, which corresponds to transistor M1 of FIG. 1, comprises a gate electrode 312 formed over a gate oxide layer 314 on a substrate 302. Preferably, a buffer oxide layer 316 is formed on the surface of the substrate 302 and along the sidewalls of the gate electrode 312. Spacers 318 are formed over the buffer oxide layer 316. In a preferred embodiment, the spacers 318 are formed of silicon nitride and the buffer oxide layer 316 is formed of silicon oxide. The gate oxide layer 314 may be formed of silicon oxide, and the gate electrode 312 may be formed of doped polysilicon. Other materials, however, may be used. In a preferred embodiment, the buffer oxide layer 316 has a thickness greater than a thickness of the gate oxide layer 314. Preferably, the buffer oxide layer 316 has a thickness greater than 20 Å, and the gate oxide layer 314 has a thickness greater than 10 Å.

A source of the transistor 310 is coupled to the photo-diode 340. The photo-diode 340 may be formed by implanting impurities via an ion implant in the substrate 302 to form, for example, a PN junction photo-diode, a PNP photo-transistor, an NPN photo-transistor, or the like.

The source of the transistor 310 is also coupled to a first bottom plate 322 of the first stacked capacitor 320 via a connection formed through a first insulating layer 324. The first insulating layer 324 is positioned between the first bottom plate 322 and the substrate 302 to insulate the first bottom plate 322 from the photo-diode 340 and the source of the transistor 310. A first capacitor dielectric layer 326 is positioned between the first bottom plate 322 and a first top plate 328, which may be coupled to a bias, such as ground, $V_{DD}$, $0.5*V_{DD}$, or the like (not shown). The first bottom plate 322 and the first top plate 328 may be formed, for example, of doped polysilicon. The first capacitor dielectric layer 326 may be formed of a dielectric material, such as silicon oxide, an oxide/nitride/oxide insulating film, or the like. Other materials may be used.

The drain of the transistor 310 is electrically coupled to the second stacked capacitor 330 via a second bottom plate 332, which may also be electrically coupled to a drain of a reset transistor and a gate of a drive transistor (not shown, see FIG. 1). A second insulating layer 334 is positioned between the second bottom plate 332 and the drain and has a connection formed therethrough to electrically couple the second bottom plate 332 to the drain of the transistor 310. The second insulating layer 334 may, for example, be formed of silicon oxide during the same processing step used to form the first insulating layer 324.

A second capacitor dielectric layer 338 is formed over the second bottom plate 332, and a second top plate 336 is formed over the second capacitor dielectric layer 338. The second top plate 336 may be coupled to a bias, such as ground, $V_{DD}$, $0.5*V_{DD}$, or the like. The second bottom plate 332 and the second top plate 336 may be formed, for example, of doped polysilicon.

Figure 4:
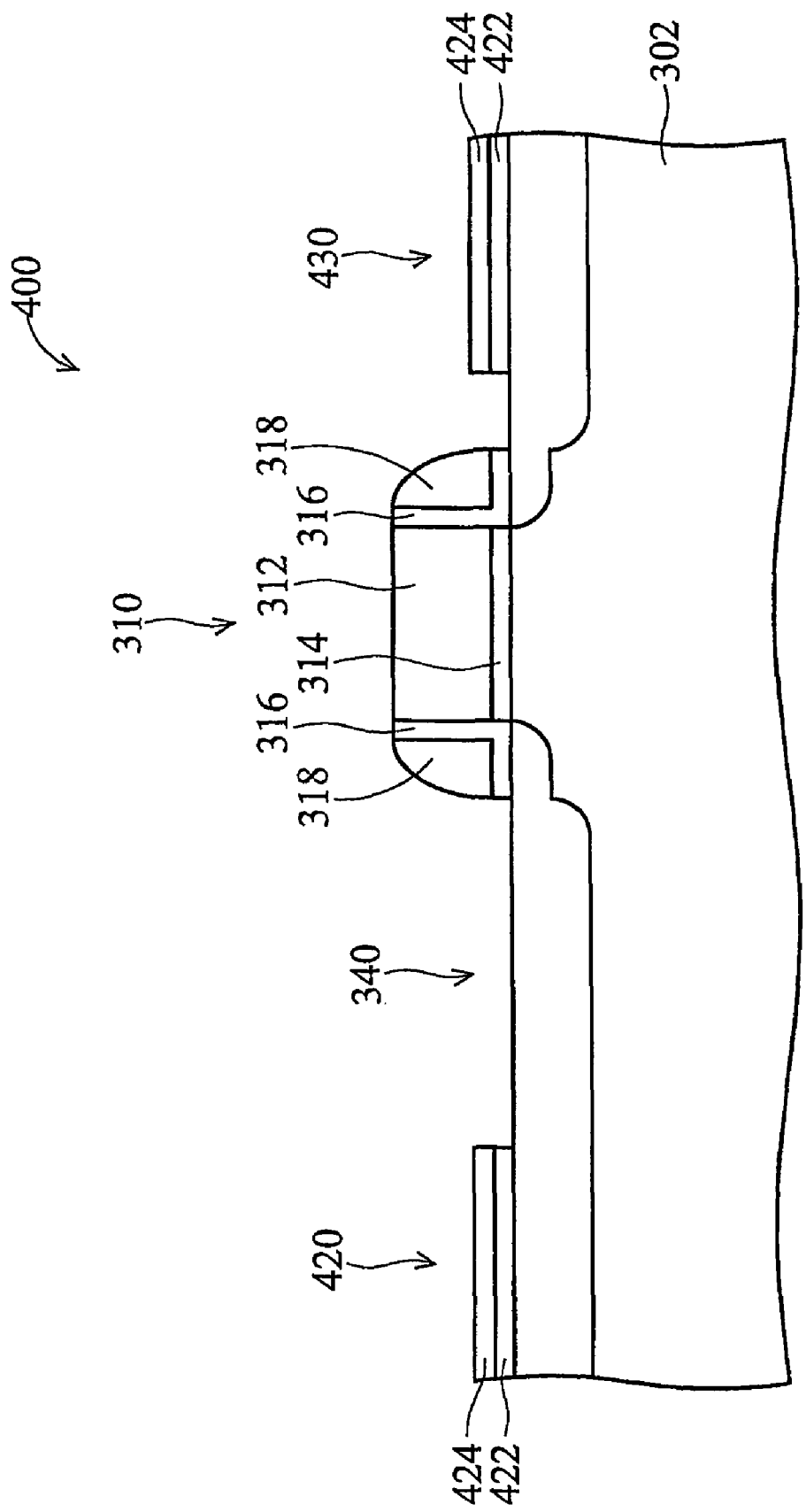
FIG. 4 is a cross section figure of an image pixel utilizing planar capacitors in accordance with an embodiment of the present invention.

FIG. 4 is a cross section of a portion of a pixel 400 utilizing a pair of planar capacitors in accordance with an embodiment of the present invention. The pixel 400 of FIG. 4 is similar to the pixel 300 of FIG. 3, except that the first stacked capacitor 320 and the second stacked capacitor 330 of FIG. 3 have been replaced with a first planar capacitor 420 and a second planar capacitor 430. Other elements, such as the transistor 310 and the photo-diode 340 are preferably as discussed above with reference to FIG. 3, where like reference numerals refer to like elements.

In this embodiment, each of the first planar capacitor 420 and the second planar capacitor 430 have a dielectric layer 422 formed on a doped portion of the substrate 302, and a top plate 424 formed on the dielectric layer 422. The dielectric layer 422 may be, for example, a dielectric material such as silicon oxide, an oxide/nitride/oxide insulating film, or the like. The top plate 424 may be, for example, doped polysilicon. Other materials may be used.

Figure 5:
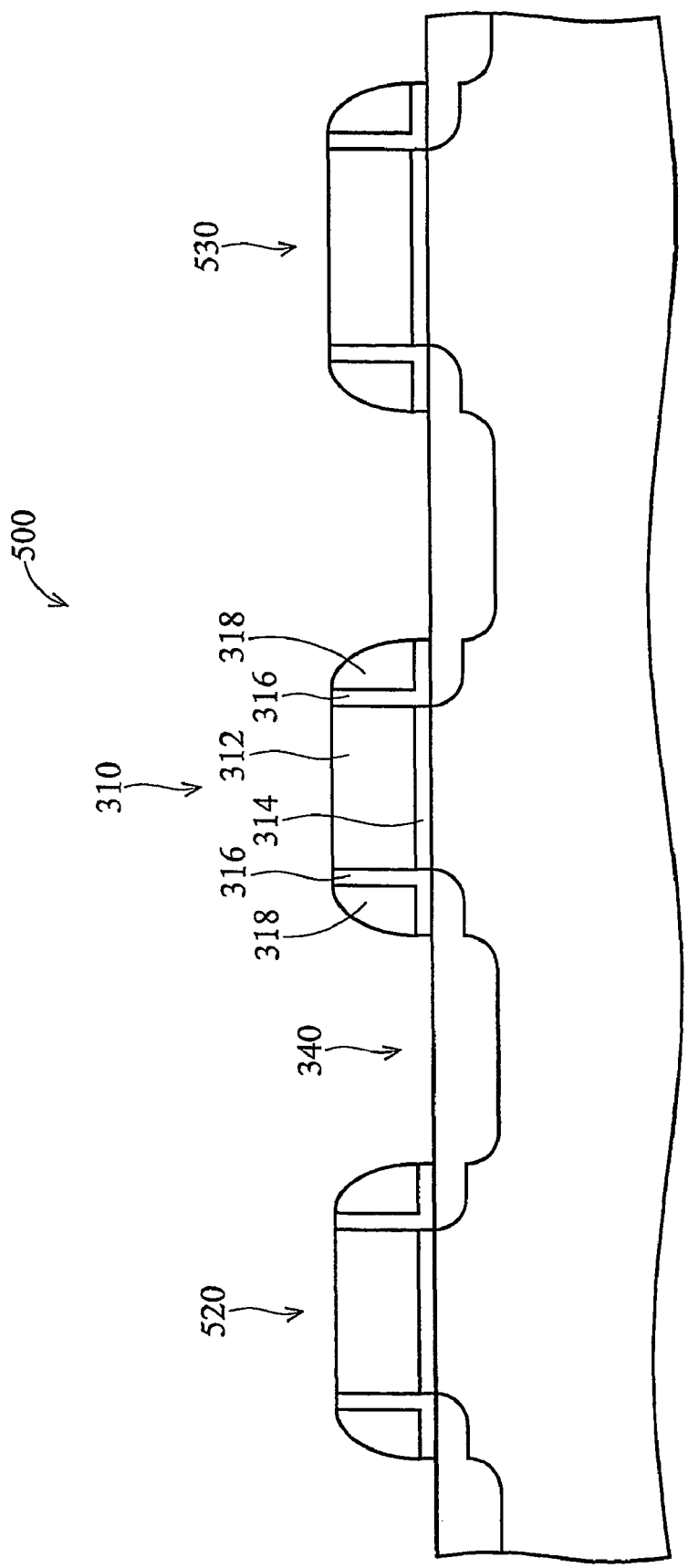
FIG. 5 is a cross section figure of an image pixel utilizing planar MOS capacitors in accordance with an embodiment of the present invention.

FIG. 5 is a cross section of a portion of a pixel 500 utilizing a pair of MOS capacitors in accordance with an embodiment of the present invention. The pixel 500 of FIG. 4 is similar to the pixel 300 of FIG. 3, except that the first stacked capacitor 320 and the second stacked capacitor 330 of FIG. 3 have been replaced with a first MOS capacitor 520 and a second MOS capacitor 530. Other elements, such as the transistor 310 and the photo-diode 340 are preferably as discussed above with reference to FIG. 3, where like reference numerals refer to like elements.

In this embodiment, each of the first MOS capacitor 520 and the second MOS capacitor 530 comprise a MOS transistor formed along a planar surface of the substrate 302. A gate of each of the first MOS capacitor 520 and the second MOS capacitor 530 is electrically coupled to a bias, such as ground, $V_{DD}$, $0.5*V_{DD}$, or the like. In this manner, a capacitance may be created by the conductor-dielectric-conductor layers of the source/drain-gate dielectric-gate electrode layers of the MOS transistor. The first MOS capacitor 520 and the second MOS capacitor 530 may be formed simultaneously as the transistor 310, the process of which is described above with reference to FIG. 3.

Figure 6:
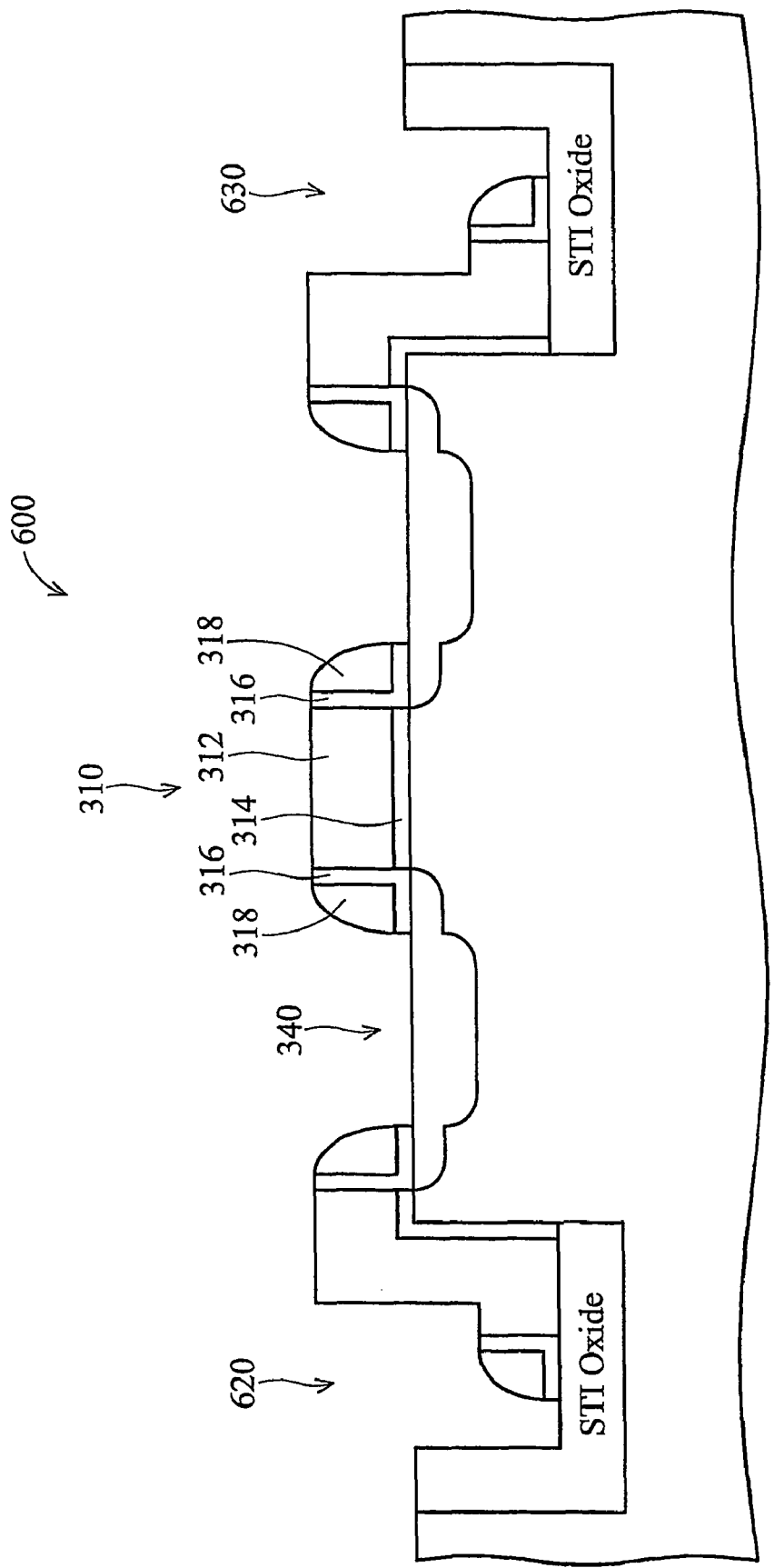
FIG. 6 is a cross section figure of an image pixel utilizing vertical MOS capacitors in accordance with an embodiment of the present invention.

FIG. 6 is a cross section of a portion of a pixel 600 utilizing a pair of MOS capacitors in accordance with an embodiment of the present invention. The pixel 600 of FIG. 6 is similar to the pixel 300 of FIG. 3, except that the first stacked capacitor 320 and the second stacked capacitor 330 of FIG. 3 have been replaced with a first MOS capacitor 620 and a second MOS capacitor 630. Other elements, such as the transistor 310 and the photo-diode 340 are preferably as discussed above with reference to FIG. 3, where like reference numerals refer to like elements.

In this embodiment, each of the first MOS capacitor 620 and the second MOS capacitor 630 comprise a MOS transistor formed along an edge of a shallow trench isolation structure (STI). The first MOS capacitor 620 and the second MOS capacitor 630 may be formed simultaneously as the transistor 310, the process of which is described above with reference to FIG. 3. A gate of each of the first MOS capacitor 620 and the second MOS capacitor 630 is electrically coupled to a bias, such as ground, $V_{DD}$, $0.5*V_{DD}$, or the like.

Figure 7:
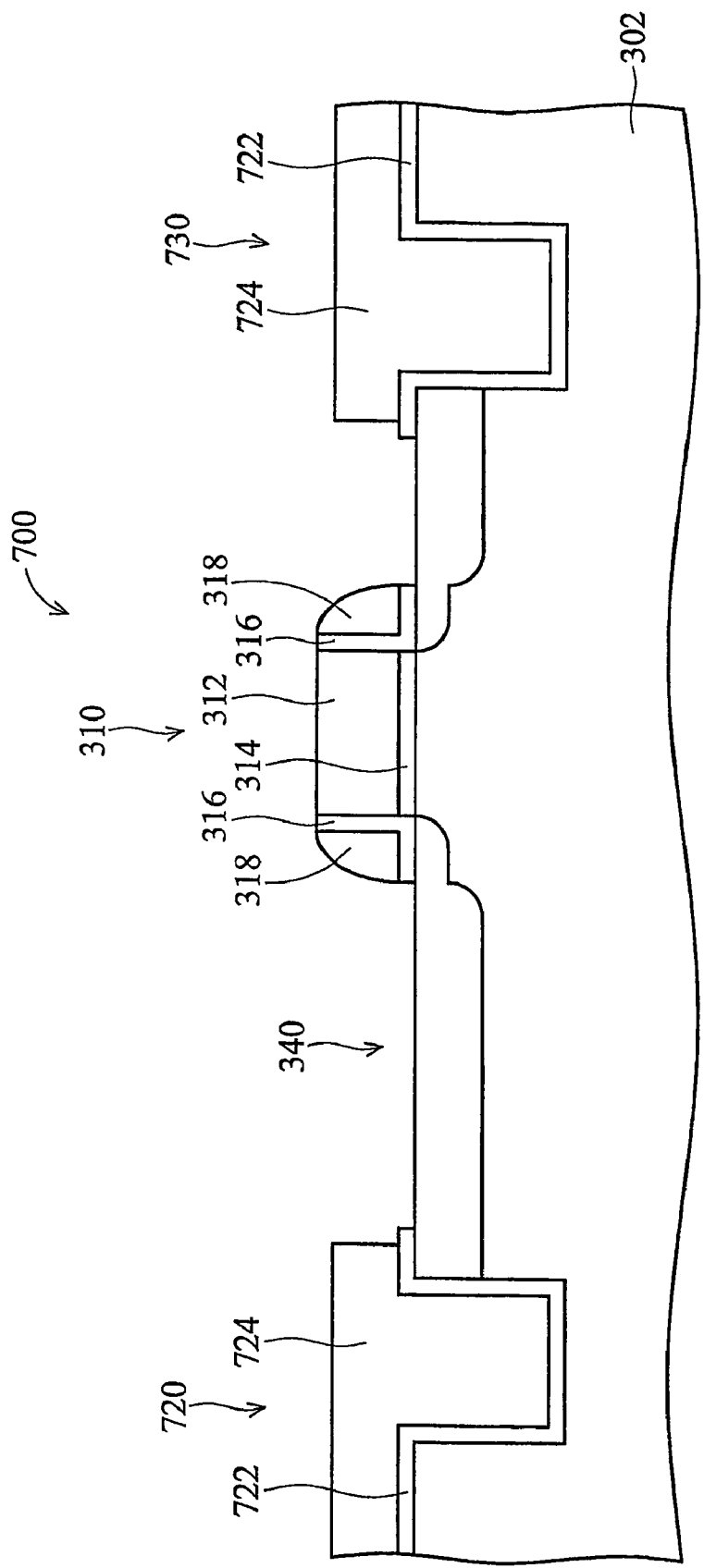
FIG. 7 is a cross section figure of an image pixel utilizing trench capacitors in accordance with an embodiment of the present invention.

FIG. 7 is a cross section of a portion of a pixel 700 utilizing a pair of trench capacitors in accordance with an embodiment of the present invention. The pixel 700 of FIG. 7 is similar to the pixel 300 of FIG. 3, except that the first stacked capacitor 320 and the second stacked capacitor 330 of FIG. 3 have been replaced with a first trench capacitor 720 and a second trench capacitor 730. Other elements, such as the transistor 310 and the photo-diode 340 are preferably as discussed above with reference to FIG. 3, where like reference numerals refer to like elements.

In this embodiment, each of the first trench capacitor 720 and the second trench capacitor 730 are formed in a trench formed in the substrate 302. A dielectric layer 722 is formed along the surface of the trench. A top plate 724 is formed over the dielectric layer 722 and is formed of a conductive material that typically fills the trench. In an embodiment, the conductive material is formed of doped polysilicon. The bottom plate comprises a doped portion of the substrate 302. The dielectric layer 722 may be, for example, a dielectric material such as silicon oxide, an oxide/nitride/oxide insulating film, or the like. Other materials may be used.

Figure 8:
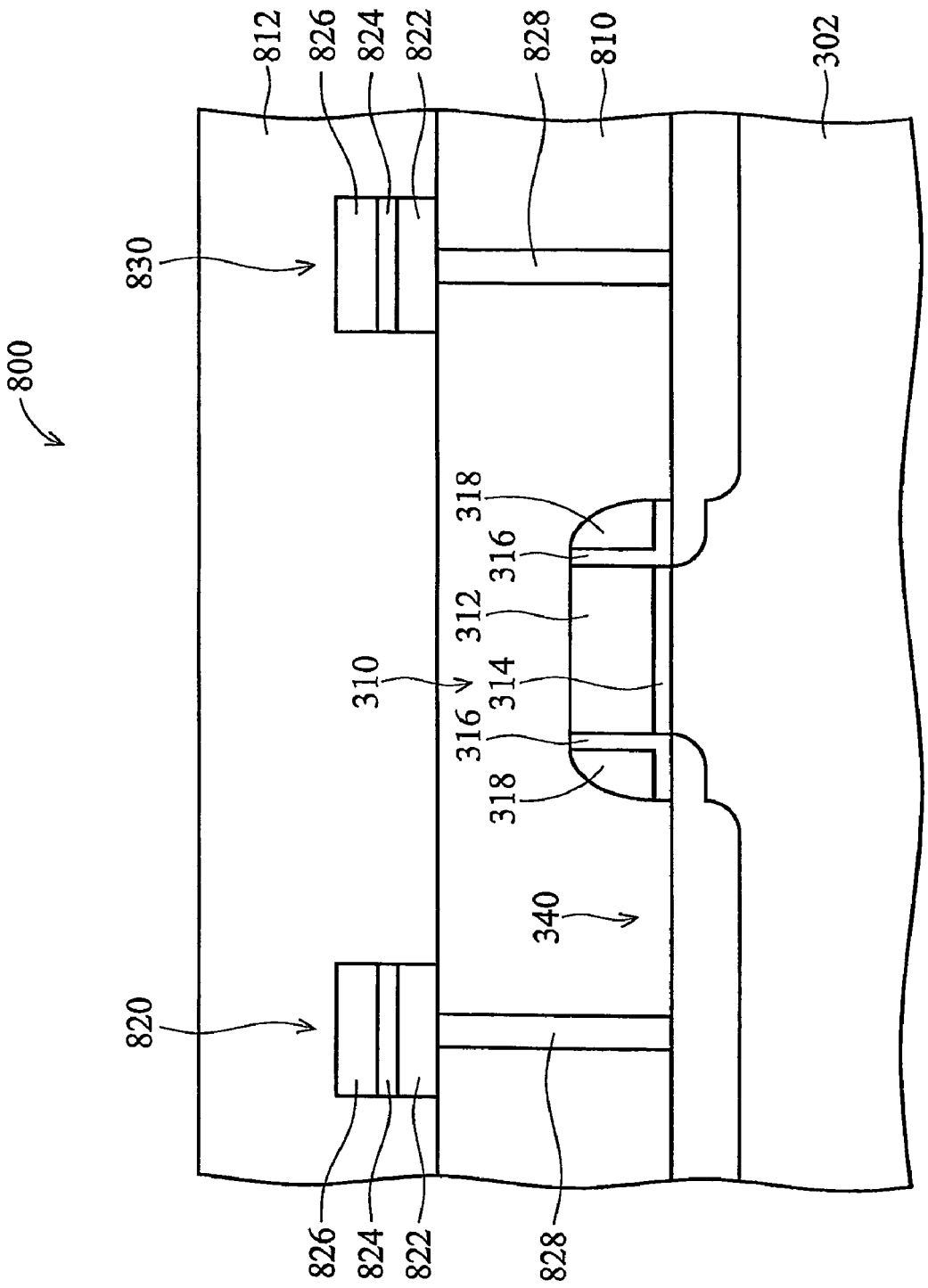
FIG. 8 is a cross section figure of an image pixel utilizing MIN capacitors in accordance with an embodiment of the present invention.

FIG. 8 is a cross section of a portion of a pixel 800 utilizing a pair of metal-insulator-metal (MIM) capacitors (or poly-insulator-poly capacitors) in accordance with an embodiment of the present invention. The pixel 800 of FIG. 8 is similar to the pixel 300 of FIG. 3, except that the first stacked capacitor 320 and the second stacked capacitor 330 of FIG. 3 have been replaced with a first MIM capacitor 820 and a second MIM capacitor 830. Other elements, such as the transistor 310 and the photo-diode 340 are preferably as discussed above with reference to FIG. 3, where like reference numerals refer to like elements. It should be noted that the MIM capacitor is shown in FIG. 8 as a stacked capacitor for illustrative purposes only. In other embodiments, the MIM capacitor may be a trench capacitor, another vertical capacitor design, or the like.

In this embodiment, each of the first MIM capacitor 820 and the second MIM capacitor 830 are formed on a first interlayer dielectric (ILD) 810. The first ILD 810 preferably comprises an oxide that may be formed by chemical vapor deposition (CVD) techniques using tetra-ethyl-ortho-silicate (TEOS) and oxygen as a precursor. The surface of the first ILD 810 may be planarized by, for example, a CMP process. Vias 828 may be formed through the first ILD layer to provide electrical connectivity to the underlying circuitry.

Each of the first MIM capacitor 820 and the second MIM capacitor 830 preferably comprises a bottom electrode 822, a dielectric layer 824 formed over the bottom electrode 822, and a top electrode 826 formed over the dielectric layer 824. The top and bottom electrodes may be formed of a conductive material such as TiN, TaN, ruthenium, aluminum, tungsten, copper, or the like, and may be formed, for example, by CVD. The dielectric layer 824 is preferably a high-K dielectric film, such as $Ta_2O_5$, $Al_2O_3$, $HFO_2$, BST, PZT, an oxide, other multi-layer high-K dielectric, or the like. The dielectric layer may be formed, for example, by CVD techniques.

A second ILD 812 may be formed over the first MIM capacitor 820 and the second MIM capacitor 830. The second ILD 812 may be formed similarly to the first ILD 810. It should be noted that additional layers may also be present. For example, etch stop layers may be formed between ILDs and on the surface of the substrate 302; barrier layers may be formed, such as barrier layers along sidewalls of the vias 828; regions may be silicided; or the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An image sensor comprising:
   a plurality of pixel imaging units, each pixel imaging unit comprising:
   an optical sensing element;
   a transistor electrically coupled to the optical sensing element, the transistor having a gate electrode over a gate dielectric and spacers alongside the gate electrode, the spacers comprising a nitride spacer over a buffer oxide; and
   a plurality of capacitors, at least one capacitor electrically coupled continuously to the transistor and the optical sensing element and at least one capacitor electrically coupled to a gate of another transistor, the plurality of capacitors being separate devices from the optical sensing element and the transistor.

2. The image sensor of claim 1, wherein the plurality of capacitors comprises a planar capacitor.

3. The image sensor of claim 1, wherein the plurality of capacitors comprises a stacked capacitor.

4. The image sensor of claim 1, wherein the plurality of capacitors comprises a MOS capacitor formed on a planar surface of a substrate.

5. The image sensor of claim 1, wherein the plurality of capacitors comprises a MOS capacitor formed along a sidewall of a shallow trench isolation structure.

6. The image sensor of claim 1, wherein the plurality of capacitors comprises a metal-insulator-metal (MIM) capacitor.

7. The image sensor of claim 1, wherein the plurality of capacitors comprises a poly-insulator-poly capacitor.

8. The image sensor of claim 1, wherein the buffer oxide is thicker than the gate dielectric.

9. The image sensor of claim 1, wherein the image sensor comprises a three-transistor pixel.

10. The image sensor of claim 1, wherein the image sensor comprises a four-transistor pixel.

11. A pixel imaging unit having four transistors, the pixel imaging unit comprising:
    an optical sensing element;
    a first transistor electrically coupled to the optical sensing element, the first transistor having a gate electrode over a gate dielectric and spacers alongside the gate electrode, the spacers comprising a nitride spacer over a buffer oxide;
    a first capacitor electrically coupled to a source of the first transistor and the optical sensing element, an electrical connection between the first capacitor, the source of the first transistor, and the optical sensing element being constant and unswitched, the first capacitor being a separate device from the optical sensing element; and
    a second capacitor electrically coupled to a drain of the first transistor and a gate of a second transistor of the pixel imaging unit.

12. The pixel imaging unit of claim 11, wherein at least one of the first capacitor and the second capacitor comprises a planar capacitor.

13. The pixel imaging unit of claim 11, wherein at least one of the first capacitor and the second capacitor comprises a stacked capacitor.

14. The pixel imaging unit of claim 11, wherein at least one of the first capacitor and the second capacitor comprises a MOS capacitor formed on a planar surface of a substrate.

15. The pixel imaging unit of claim 11, wherein at least one of the first capacitor and the second capacitor comprises a MOS capacitor formed along a sidewall of a shallow trench isolation structure.

16. The pixel imaging unit of claim 11, wherein at least one of the first capacitor and the second capacitor comprises a metal-insulator-metal (MIM) capacitor.

17. The pixel imaging unit of claim 11, wherein at least one of the first capacitor and the second capacitor comprises a poly-insulator-poly capacitor.

18. The pixel imaging unit of claim 11, wherein the buffer oxide is thicker than the gate dielectric.

19. A method of forming an image sensor, the method comprising:
    forming an optical sensing element;
    forming a transfer transistor electrically coupled to the optical sensing element, the transfer transistor having a gate electrode over a gate dielectric and spacers alongside the gate electrode, the spacers comprising a nitride spacer over a buffer oxide; and
    forming one or more capacitors, the one or more capacitors including a first capacitor electrically coupled directly to the transfer transistor and the optical sensing element and a second capacitor electrically coupled between the transfer transistor and a select transistor, the first capacitor being a separate device from the optical sensing element.

20. The method of claim 19, wherein the forming the first capacitor comprises forming a planar capacitor.

21. The method of claim 19, wherein the forming the first capacitor comprises forming a stacked capacitor.

22. The method of claim 19, wherein the forming the first capacitor comprises forming a MOS capacitor formed on a planar surface of a substrate.

23. The method of claim 19, wherein the forming the first capacitor comprises forming a MOS capacitor along a sidewall of a shallow trench isolation structure.

24. The method of claim 19, wherein the forming the first capacitor comprises forming a metal-insulator-metal (MIM) capacitor.

25. The method of claim 19, wherein the forming the first capacitor comprises forming a poly-insulator-poly capacitor.

26. The method of claim 19, wherein the buffer oxide is thicker than the gate dielectric.

27. The method of claim 19, wherein the image sensor comprises a three-transistor pixel.

28. The method of claim 19, wherein the image sensor comprises a four-transistor pixel.

* * * * *